US011499666B2

(12) United States Patent
Schaller et al.

(10) Patent No.: US 11,499,666 B2
(45) Date of Patent: Nov. 15, 2022

(54) PRECISION DYNAMIC LEVELING MECHANISM WITH LONG MOTION CAPABILITY

(71) Applicant: Applied Materials, Inc., Santa Clara, CA (US)

(72) Inventors: Jason M. Schaller, Austin, TX (US); Michael P. Rohrer, Cedar Park, TX (US); Tuan Anh Nguyen, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 198 days.

(21) Appl. No.: 16/400,090

(22) Filed: May 1, 2019

(65) Prior Publication Data

US 2019/0360633 A1 Nov. 28, 2019

Related U.S. Application Data

(60) Provisional application No. 62/724,186, filed on Aug. 29, 2018, provisional application No. 62/676,880, filed on May 25, 2018.

(51) Int. Cl.
*F16M 11/18* (2006.01)
*F16M 11/12* (2006.01)
(Continued)

(52) U.S. Cl.
CPC .............. *F16M 11/18* (2013.01); *C23C 16/44* (2013.01); *F16F 1/12* (2013.01); *F16M 11/046* (2013.01); *F16M 11/121* (2013.01); *H01L 21/68* (2013.01); *H01L 21/68764* (2013.01); *F16F 2228/08* (2013.01); *F16M 2200/041* (2013.01)

(58) Field of Classification Search
None
See application file for complete search history.

(56) References Cited

U.S. PATENT DOCUMENTS 3,678,706 A * 7/1972 Shirley .................. F16D 3/227
464/15
4,083,298 A * 4/1978 Schotten ................ B01D 25/19
100/214

(Continued)

FOREIGN PATENT DOCUMENTS

| JP | H08-75421 A | 3/1996 |
| JP | 2000-223411 A | 8/2000 |

OTHER PUBLICATIONS

PCT Notification of Transmittal of the International Search Report and the Written Opinion of the International Searching Authority for International Application No. PCT/US2019/030737; dated Aug. 26, 2019; 10 total pages.

*Primary Examiner* — Keath T Chen
*Assistant Examiner* — Margaret Klunk
(74) *Attorney, Agent, or Firm* — Patterson + Sheridan, LLP

(57) ABSTRACT

Embodiments described herein relate to a precision dynamic leveling mechanism for repeatedly positioning the pedestal within a process. The precision dynamic leveling mechanism includes bearing assemblies. Bearing assemblies having inner races forced against a pedestal assembly carrier and outer races forced against a guide adaptor provide nominal clearance between the inner races and outer races to allow the inner races and the outer races to slide on each other with minimal or no radial motion.

20 Claims, 3 Drawing Sheets

(51) Int. Cl.
*F16F 1/12* (2006.01)
*C23C 16/44* (2006.01)
*H01L 21/687* (2006.01)
*F16M 11/04* (2006.01)
*H01L 21/68* (2006.01)

(56) References Cited

U.S. PATENT DOCUMENTS

| | | | |
|---|---|---|---|
| 4,585,337 A | | 4/1986 | Phillips |
| 5,639,160 A | * | 6/1997 | Kishimoto .......... B01F 11/0028 366/208 |
| 10,249,525 B2 | | 4/2019 | Schaller et al. |
| 2004/0177813 A1 | * | 9/2004 | Schieve ............ H01L 21/68785 118/728 |
| 2004/0244694 A1 | * | 12/2004 | Hayashi ............ H01L 21/68742 118/728 |
| 2007/0195435 A1 | * | 8/2007 | Theriault ................ G02B 7/004 359/819 |
| 2012/0152701 A1 | * | 6/2012 | Kern ..................... F16C 13/006 198/842 |
| 2016/0315000 A1 | * | 10/2016 | Nguyen ............ H01L 21/67184 |
| 2016/0355927 A1 | * | 12/2016 | Weaver ............ H01L 21/68771 |
| 2017/0110352 A1 | | 4/2017 | Tobin |
| 2018/0096874 A1 | * | 4/2018 | Schaller ................ C23C 16/458 |
| 2018/0102265 A1 | | 4/2018 | Somervell et al. |
| 2018/0367713 A1 | * | 12/2018 | Gilbert .................... F16M 11/14 |

\* cited by examiner

PRECISION DYNAMIC LEVELING MECHANISM WITH LONG MOTION CAPABILITY

CROSS-REFERENCE TO RELATED APPLICATIONS

This application claims benefit of U.S. Provisional Patent Application Ser. No. 62/676,880, filed May 25, 2018, and U.S. Provisional Patent Application Ser. No. 62/724,186, filed Aug. 29, 2018, which are herein incorporated by reference.

BACKGROUND

Field

Embodiments of the present disclosure generally relate to an apparatus for processing a substrate within a processing chamber.

Description of the Related Art

Most semiconductor device formation processes are improved when the uniformity of the processes performed on the substrate surface is improved. One of the parameters which may affect uniformity of a deposition, etching or thermal treatment process is the position of the substrate relative to one or more of the chamber components found in the processing chamber, such as a showerhead, during processing. As a result, processing systems are typically designed to provide a uniform and reproducible placement of substrates relative to the one or more of the chamber components in the processing chamber during one or more of the processing steps.

Oxide and nitride chemical vapor deposition processes each have a different uniformity response to a pedestal's tilt and position relative to the one or more of the chamber components, such as the showerhead. These materials are deposited in the same chamber in an alternating process that layers oxide and nitride films. To assure optimal process results, each layer requires an independently tuned pedestal tilt and position relative to the showerhead to achieve the best process results. Currently, the pedestal position and orientation is not automated to move with a predetermined positional resolution.

Therefore, there is a need for a precision dynamic leveling mechanism for repeatedly positioning the pedestal within a process chamber with improved positional resolution.

SUMMARY

In one embodiment, a lift assembly is provided. The lift assembly includes a base bracket, a pedestal assembly carrier configured to support a pedestal assembly comprising a stem and a pedestal, and three or more servo motor assemblies that are each attached to the base bracket via pivot joints and to the pedestal assembly carrier by three or more bearing assemblies. Each bearing assembly includes a guide adaptor connected to a guide actuator and the pedestal assembly carrier of the lift assembly, and a bolt and a spring inserted through a pocket in the guide adaptor to connect a bearing to the pedestal assembly carrier. The bearing has an inner race and an outer race. The inner race is forced against the pedestal assembly carrier and the outer race is forced against the guide adaptor.

In another embodiment, a spherical thrust bearing assembly is provided. The spherical thrust bearing assembly includes a guide adaptor connected to a guide actuator and a pedestal assembly carrier of a lift assembly. The lift assembly includes a base bracket, a pedestal assembly carrier configured to support a pedestal assembly comprising a stem and a pedestal, and three or more servo motor assemblies. Each servo motor assembly is attached to the base bracket via pivot joints and to the pedestal assembly carrier by a bearing assembly. A bolt and a spring are inserted through a pocket in the guide adaptor to connect a bearing to the pedestal assembly carrier. The bearing has an inner race and an outer race. The inner race is forced against the pedestal assembly carrier and the outer race is forced against the guide adaptor.

In yet another embodiment, a chamber is provided. The chamber includes a chamber lid, a plurality of chamber walls, a chamber base, a process region defined by the chamber lid, the plurality of chamber walls, and the chamber base. The chamber also includes a lift assembly. The lift assembly includes a base bracket a pedestal assembly carrier configured to support a pedestal assembly comprising a stem and a pedestal, three or more servo motor assemblies that are each attached to the base bracket via pivot joints and to the pedestal assembly carrier by three or more bearing assemblies. The stem is positioned through an opening of the chamber base and the base bracket, and the pedestal is disposed in the process region. Each bearing assembly includes a guide adaptor connected to a guide actuator and the pedestal assembly carrier of the lift assembly, and a bolt and a spring inserted through a pocket in the guide adaptor to connect a bearing to the pedestal assembly carrier. The bearing has an inner race and an outer race. The inner race is forced against the pedestal assembly carrier and the outer race is forced against the guide adaptor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a precision dynamic leveling mechanism for repeatedly positioning the pedestal within a process chamber with a positional resolution of less than 0.001" to provide a uniform and reproducible placement of a substrate relative to the showerhead.

Bearing assemblies having inner races forced against a pedestal assembly carrier and outer races forced against a guide adaptor provide nominal clearance between the inner races and outer races to allow the inner races and the outer races to slide on each other without radial motion. Thus, the spherical thrust bearing assemblies give a lift assembly the flexibility to move in 3 degrees of freedom (elevation, pitch and roll) with a positional resolution of less than 0.001".

Figure 1:
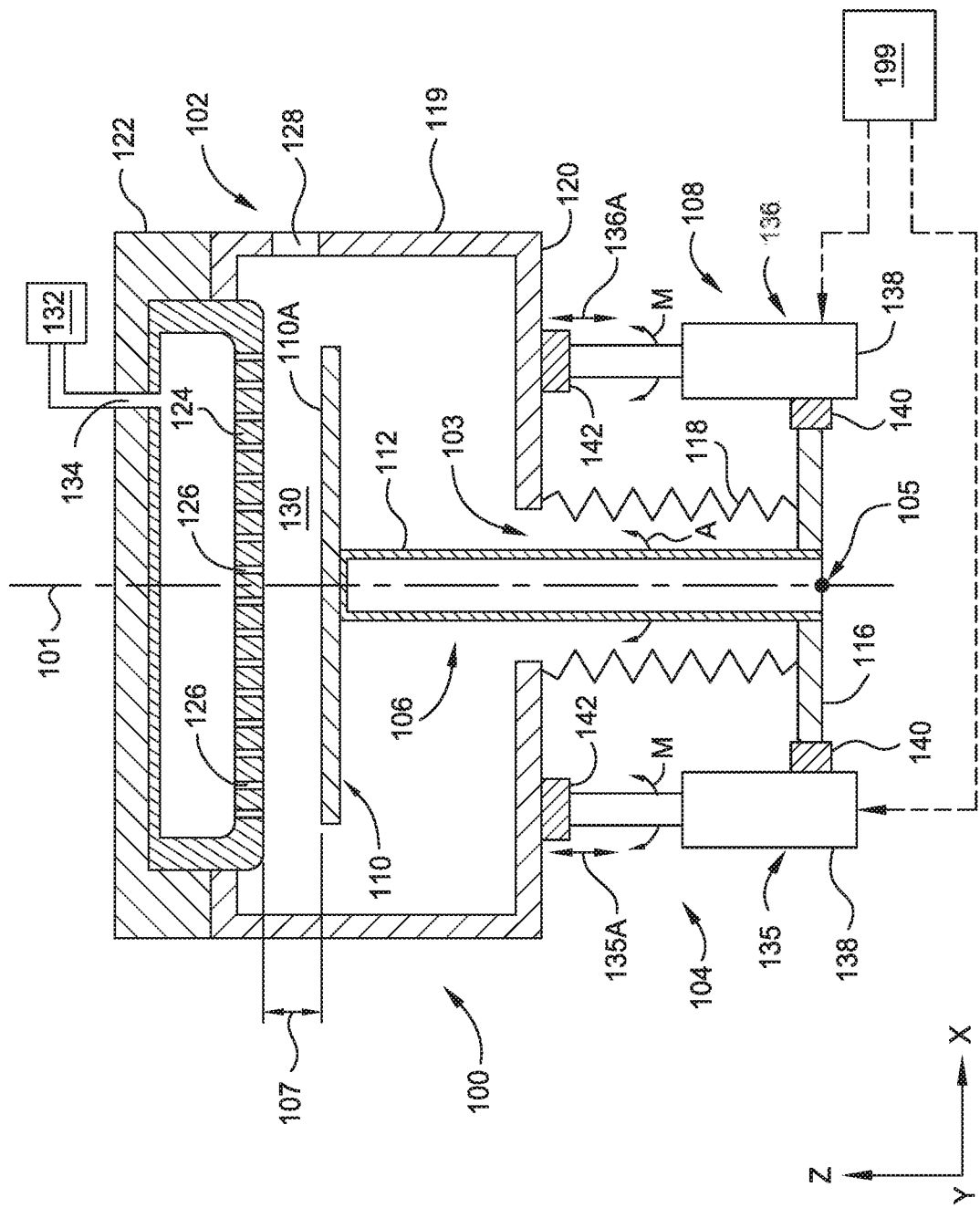
FIG. 1 is a schematic cross-sectional view of a chemical vapor deposition system according to an embodiment.

FIG. 1 is a schematic cross-sectional view of a chemical vapor deposition (CVD) system 100. One example of the system 100 is a PRECISION™ chamber manufactured by Applied Materials, Inc., located in Santa Clara, Calif. It is to be understood that the system described below is an exemplary system and other systems, including systems from other manufacturers, may be used with or modified to accomplish aspects of the present disclosure.

The system 100 includes a processing chamber 102 and substrate support assembly 104 for lifting and positioning a substrate within the processing chamber 102. The processing chamber 102 includes chamber walls 119, a chamber base 120, and a chamber lid 122 disposed at the top of the processing chamber 102 and opposite to the chamber base 120. The processing chamber 102 includes a showerhead 124 suspended from the chamber lid 122 and projecting downward from the chamber lid 122 into the processing chamber 102. A slit valve 128 in one of the chamber walls 119 permits the introduction of a substrate (not shown) into the processing chamber 102. A gas supply source 132 provides a process gas or gasses through a gas inlet passage 134 within the chamber lid 122 and through holes 126 of the showerhead 124 to a process region 130. The process region 130 is defined by the chamber lid 122, the chamber walls 119, and the chamber base 120.

The substrate support assembly 104 generally includes a pedestal assembly 106 and lift assembly 108. The pedestal assembly 106 includes a pedestal 110 for supporting a substrate (not shown) within the processing chamber 102. The pedestal 110 typically includes a heating element (not shown) to heat the substrate during processing. The pedestal 110 is supported by a stem 112 coupled to a pedestal assembly carrier 116 of the lift assembly 108. The stem 112 is disposed within processing chamber 102 through an opening 103. A flexible sealing member 118, such as a bellows assembly, provides a seal between the lift assembly 108 and the processing chamber 102 that allows the processing chamber 102 to be maintained at a desired pressure, such as vacuum pressure. The lift assembly 108 is configured to manipulate the position and/or orientation of the pedestal assembly carrier 116 relative to the showerhead 124, which can result in a tilt of the pedestal assembly 106 relative to a center axis 101 of the processing chamber 102.

Figure 2A:
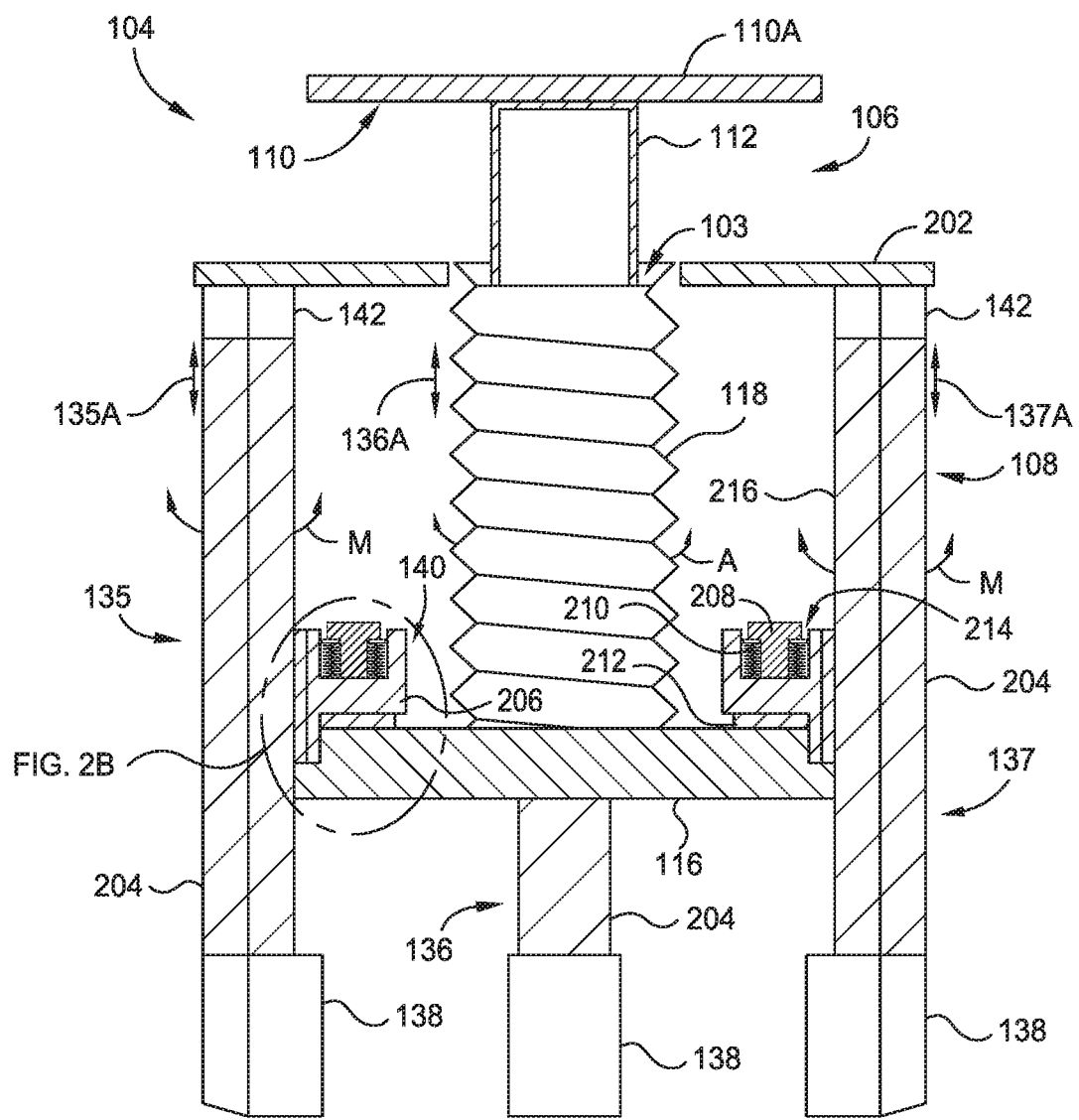
FIG. 2A is a schematic cross-sectional view of a lift assembly according to an embodiment.

The pedestal assembly carrier 116 is generally adapted to be moved vertically in a direction that is parallel to a center axis 101, which extends through opening 103 in the chamber base 120, by three or more servo motor assemblies 135, 136, 137 (shown in FIG. 2A). Spherical thrust bearing assemblies 140 couple the pedestal assembly carrier 116 to the servo motor assemblies 135, 136, 137 disposed below the processing chamber 102. Joints having only one rotational degree of freedom, for example pivot joints 142, connect the servo motor assemblies 135, 136, 137 to the chamber base 120 and further secure the lift assembly 108 to the chamber base 120. The servo motor assemblies 135, 136, 137 each include a drive assembly and encoder assembly for determining the position of components within the apparatus that are in communication with a system controller 199. In one example, the drive assemblies within the servo motor assemblies 135, 136, 137 include servo motors 138, although other motion actuator assemblies may be used.

In operation, system controller 199 causes the servo motors 138 to drive the pedestal assembly carrier 116 in a linear direction 135A, 136A, and 137A (shown in FIG. 2A) to position the pedestal 110 at a desired processing location relative to the showerhead 124 or substrate transfer location relative to the slit valve 128 within the processing region 130. Servo motor assemblies 135, 136, 137 can raise and lower the pedestal 110 on a level plane (e.g., parallel to the X-Y plane) relative to showerhead 124 when the servo motor assemblies 135, 136, 137 are driven at the same time with the same velocity relative to the Z axis, or parallel along center axis 101, such that a distance 107 between showerhead 124 and pedestal 110 is the same across a top surface 110A of the pedestal 110. Servo motors assemblies 135, 136, 137 may also be independently controlled to statically or dynamically manipulate the orientation (e.g., tilt) of the pedestal 110 relative to showerhead 124 to increase process uniformity across a substrate. The system controller 199 may include a central processing unit (CPU), memory, and support circuits (or I/O) to facilitate system control.

To accommodate process operations where the orientation of the pedestal 110 effects the uniformity of a process performed on an exposed surface of a substrate, the system controller 199 can cause three or more servo motor assemblies 135, 136, 137 to drive at different velocities, in different directions and/or to different vertical positions to manipulate the position and/or orientation of the pedestal assembly carrier 116 relative to the showerhead 124. Manipulation of the position and/or orientation of the pedestal assembly carrier 116 can result in a tilt of the stem 112 and the pedestal 110 about a pivot point 105 relative to the center axis 101. Spherical thrust bearing assemblies 140 facilitate movement between the pedestal assembly carrier 116 and servo motor assemblies 135, 136, 137. Pivot joints 142, attached to chamber base 120 and to the servo motor assemblies 135, 136, 137 flex due to the generated moment M created by the differing motion of the servo motor assemblies 135, 136, 137 that causes the pedestal assembly carrier 116 to pivot in a direction relative to center axis 101. The flexing of the pivot joints 142 allows for the rotation and displacement of the stem 112 coupled to the pedestal assembly carrier 116. In operation, as the servo motor assemblies 135, 136, 137 move the pedestal assembly carrier 116 vertically the pivot point 105 will be also move correspondingly to a position relative to the distance the servo motor assemblies 135, 136, 137 are moved. In this way, the pedestal 110 position and amount of tilt relative to the center axis 101 can be automatically modified for each individual process operation and film layer to improve the uniformity of each deposited layer dependent of the film stack.

FIG. 2A is a schematic view of the lift assembly 108. The lift assembly 108 includes three servo motor assemblies 135, 136, 137 that are each attached to a base bracket 202 via pivot joints 142 and to the pedestal assembly carrier 116 via a bearing assembly 140, such as a spherical thrust bearing assembly. It is to be noted that bearing assemblies other than spherical thrust bearing assemblies are contemplated. The base bracket 202 facilitates easy mounting of the lift assembly 108 to the chamber base 120. The pedestal 110 coupled to the stem 112 that is positioned through the opening 103 in the chamber base 120 and the base bracket 202. The stem 112 is coupled to the pedestal assembly carrier 116. The flexible sealing member 118 is mounted to the chamber base 120 and provides a seal between the chamber base 120 and the pedestal assembly carrier 116 and allows the processing chamber 102 to be maintained at a desired pressure. Each bearing assembly 140 includes a guide adaptor 206 connected to a guide actuator 204. A bolt 208 and spring 210 connects a bearing 212 to the pedestal assembly carrier 116. The bearing assembly 140 is discussed in more detail in reference to FIG. 2B.

The guide adaptor 206 is attached to a ball screw (not shown) portion of the guide actuator 204. Servo motors 138 drive the ball screw portion of the guide actuators 204, and thus drive the spherical thrust bearing assemblies 140 and the pedestal assembly carrier 116 in a vertical direction along the guiding elements 216 in the guide actuators 204. Driving the servo motors 138 using the same dynamic motion profiles (e.g., acceleration, velocity, movement length) will result in the orientation of the pedestal assembly carrier 116 in space to be maintained as the pedestal assembly carrier 116 is raised and lowered. However, driving the servo motors using different dynamic motion profiles allows for manipulation of the orientation of the pedestal assembly carrier 116, which can result in the tilt of the stem 112 and the pedestal 110. The pivot joints 142 attached to base bracket 202 and to servo motor assemblies 135, 136, 137 flex as the moments M are created by the motion of the servo motor assemblies 135, 136 and 137.

In one embodiment, which can be combined with other embodiments described herein, the servo motor assemblies 135, 136, 137 driven in a continuously oscillating motion (e.g., back and forth motion) cause the pedestal 110 tilted at an axis to precess about the center axis 101, as represented by movement A. In operation, the system controller 199 causes the servo motor assemblies 135, 136, 137 to continuously move using differing dynamic motion profiles to manipulate the position and/or orientation of the pedestal assembly carrier 116 and pedestal 110. Such operation causes the position and/or orientation of the pedestal 110 to continually vary as the pedestal 110 pivots about the pivot point 105 and/or moves along the center axis 101. For example, the system controller 199 causes the servo motor assemblies 135, 136, 137 to continuously move using differing dynamic motion profiles to manipulate the orientation of the pedestal assembly carrier 116 and pedestal 110 so that the orientation of the pedestal 110 relative to the showerhead 124 and center axis 101 continually varies as the pedestal 110 pivots about the pivot point 105. By continuously driving the servo motors 138, the orientation of the pedestal 110 and the stem 112 will continuously move in one or more directions relative to a stationary reference frame (e.g., X-Y-Z reference frame). A continuous tilt that causes the pedestal 110 tilted at an axis to precess about the center axis 101 for a period of time results in improved process uniformity for the deposition of certain CVD deposited films.

Figure 2B:
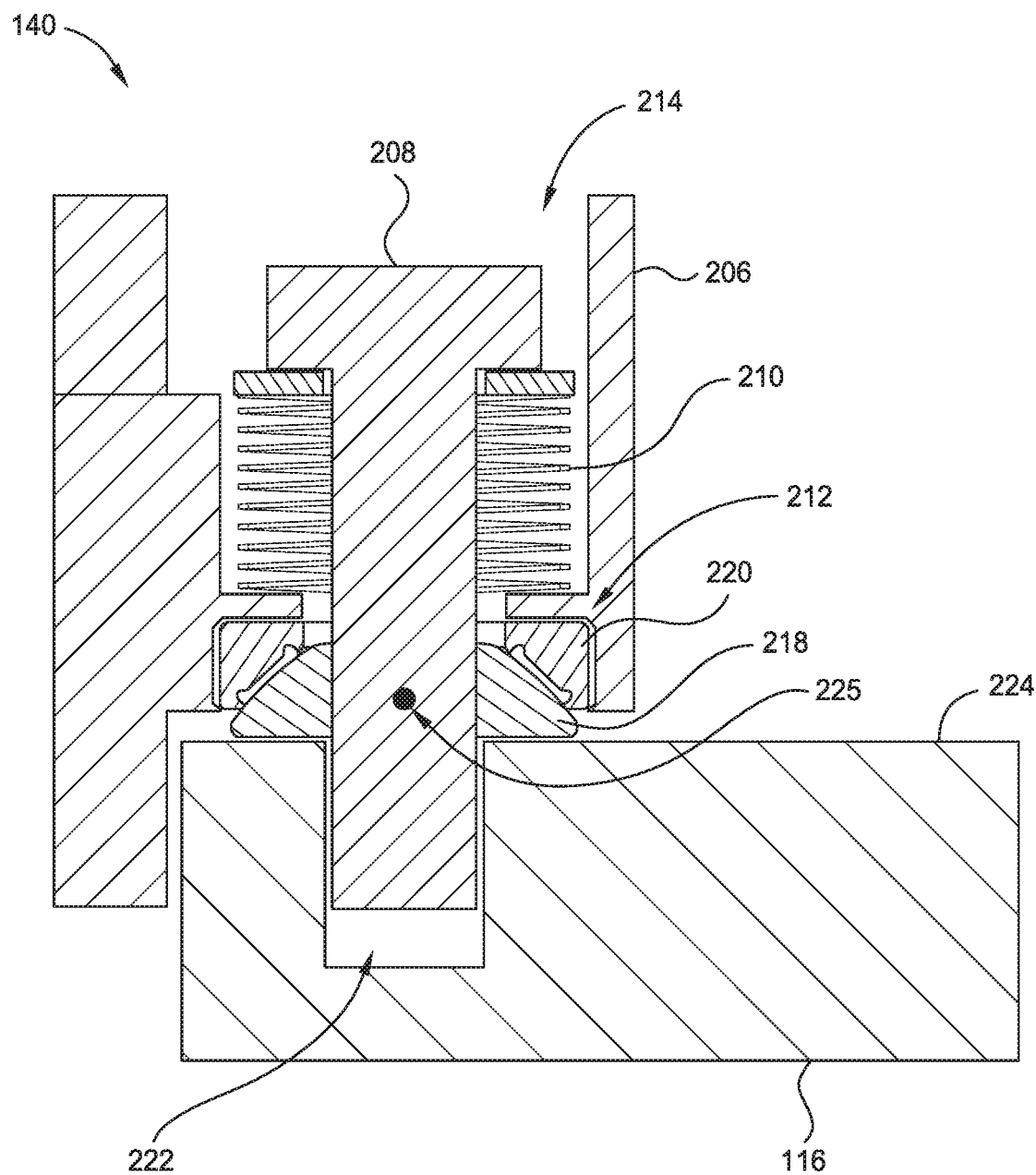
FIG. 2B is a schematic cross-sectional view of a bearing assembly according to an embodiment.

FIG. 2B is a schematic cross-sectional view of a bearing assembly 140. The bearing assembly 140 includes a guide adaptor 206 connected to a guide actuator 204. In a first configuration, as shown in FIG. 2B, the bolt 208 and the spring 210, through a pocket 214 in the guide adaptor 206, connect a bearing 212 to the pedestal assembly carrier 116. In one embodiment, which can be combined with other embodiments described herein, the bearing 212 is a spherical thrust bearing. In another embodiment, which can be combined with other embodiments described herein, the bearing 212 is an angular contact spherical bearing. In a second configuration, the bolt 208 and the spring 210, through a pocket in the pedestal assembly carrier 116, connect a bearing 212 to the pedestal assembly carrier 116. The bearing 212 includes an inner race 218 and outer race 220. The bolt 208 is inserted axially through the spring 210, the bearing 212, and into a thread hole 222 of the pedestal assembly carrier 116. In such a configuration, the bearing 212 is connected to the pedestal assembly carrier 116. The inner race 218 is in contact with a surface 224 of the bearing 212. The bolt 208 and spring 210 are axially preloaded. In one embodiment, which can be combined with other embodiments described herein, the bolt 208 and spring 210 are axially preloaded with about 3 pound-force (lbf) to about 200 lbf.

The bolt 208 and spring 210 are axially preloaded such that the outer race 220 is forced against the guide adaptor 206 and the inner race 218 is forced against the pedestal assembly carrier 116 with nominal clearance between the inner race 218 and outer race 220, e.g., the inner race 218 and the outer race 220 are registered to each other. Forcing the inner race 218 against the pedestal assembly carrier 116 and the outer race 220 against the guide adaptor 206 for nominal clearance between the inner race 218 and outer race 220 allows the inner race 218 and outer race 220 to slide on each other without translation motion, also known as radial motion, in any direction. Radial motion affects the ability of a bearing to repeatedly move with a positional resolution, such as a positional resolution of less than 0.001". Thus, bearing assembly 140 allows for 2 degrees of rotational freedom (pitch and roll) about center point 225 of the bearing 212 repeatedly with a positional resolution of less than 0.001". The combination of three servo motor assemblies configured in opposing support locations fully constrain the pedestal assembly carrier 116 motion while giving the lift assembly 108 the flexibility to move in 3 degrees of freedom (elevation, pitch and roll) with a positional resolution of less than 0.001" to provide a uniform and reproducible placement of a substrate relative to the showerhead 124.

While the foregoing is directed to examples of the present disclosure, other and further examples of the disclosure may be devised without departing from the basic scope thereof, and the scope thereof is determined by the claims that follow.

What is claimed is:

1. A lift assembly, comprising:
   a base bracket;
   a pedestal assembly comprising:
      a stem; and
      a pedestal;
   a pedestal assembly carrier configured to support the pedestal assembly; and
   three or more servo motor assemblies that are each attached to the base bracket via pivot joints and to the pedestal assembly carrier by three or more bearing assemblies, each bearing assembly comprises:
      a guide actuator;
      a guide adaptor connected to the guide actuator and the pedestal assembly carrier of the lift assembly, the guide adaptor having a first pocket and a second pocket;
      a bearing; and
      a bolt and a spring inserted through the first pocket in the guide adaptor to connect the bearing to a top surface of the pedestal assembly carrier, the bearing having an inner race and an outer race, the inner race forced against the top surface of the pedestal assembly carrier and the outer race positioned fully within the second pocket in the guide adaptor and forced against the guide adaptor, the bolt threaded into a hole of the pedestal assembly carrier.

2. The assembly of claim 1, wherein the bolt and spring are axially preloaded.

3. The assembly of claim 2, wherein the bolt and spring are axially preloaded with about 3 pound-force (lbf) to about 200 lbf.

4. The assembly of claim 1, wherein the lift assembly is configured to repeatedly move with 3 degrees of freedom with a positional resolution of less than 0.001".

5. The assembly of claim 1, wherein each pivot joint has one degree of rotational freedom.

6. The assembly of claim 1, wherein the bearing is a spherical thrust bearing.

7. The assembly of claim 1, wherein the bearing is an angular contact spherical bearing.

8. The assembly of claim 1, wherein the inner race forced against the pedestal assembly carrier and the outer race forced against the guide adaptor provides nominal clearance between the inner race and outer race.

9. The assembly of claim 1, wherein the inner race and outer race are configured to slide on each other without radial motion.

10. A spherical thrust bearing assembly, comprising:
    a pedestal assembly comprising:
        a stem; and
        a pedestal;
    a guide adaptor having a first pocket and a second pocket;
    a lift assembly comprising:
        a base bracket;
        a pedestal assembly carrier configured to support the pedestal assembly; and
        three or more servo motor assemblies, each servo motor assembly attached to the base bracket via pivot joints and to the pedestal assembly carrier by a bearing assembly;
    a guide actuator connected to the guide adaptor and the pedestal assembly carrier; and
    a bolt and a spring inserted through the first pocket in the guide adaptor to connect a bearing to a top surface of the pedestal assembly carrier, the bearing having an inner race and an outer race, the inner race forced against the top surface of the pedestal assembly carrier and the outer race positioned fully within the second pocket in the guide adaptor and forced against the guide adaptor, the bolt threaded into a hole of the pedestal assembly carrier.

11. The assembly of claim 10, wherein the bolt and spring are axially preloaded.

12. The assembly of claim 10, wherein the bolt and spring are axially preloaded with about 3 pound-force (lbf) to about 300 lbf.

13. The assembly of claim 10, wherein the lift assembly is configured to repeatedly move with 3 degrees of freedom with a positional resolution of less than 0.001".

14. The assembly of claim 10, wherein each pivot joint has one degree of rotational freedom.

15. The assembly of claim 10, wherein the inner race forced against the pedestal assembly carrier and the outer race forced against the guide adaptor provides nominal clearance between the inner race and outer race.

16. The assembly of claim 10, wherein the bearing is a spherical thrust bearing.

17. The assembly of claim 10, wherein the bearing is an angular contact spherical bearing.

18. The assembly of claim 10, wherein the inner race and the outer race are configured to slide on each other without radial motion.

19. A chamber, comprising:
    a chamber lid;
    a plurality of chamber walls;
    a chamber base;
    a process region defined by the chamber lid, the plurality of chamber walls, and the chamber base;
    a pedestal assembly comprising:
        a stem; and
        a pedestal; and
    a lift assembly, the lift assembly comprising:
        a base bracket;
        a pedestal assembly carrier configured to support the pedestal assembly, the stem positioned through an opening of the chamber base and the base bracket, and the pedestal disposed in the process region;
        pivot joints coupled to the base bracket;
        three or more bearing assemblies, each bearing assembly comprising:
            a guide adaptor connected to a guide actuator and the pedestal assembly carrier of the lift assembly, the guide adaptor having a first pocket and a second pocket;
            a bearing; and
            a bolt and a spring inserted through the first pocket in the guide adaptor to connect the bearing to a top surface of the pedestal assembly carrier, the bearing having an inner race and an outer race, the inner race forced against the top surface of the pedestal assembly carrier and the outer race positioned fully within the second pocket in the guide adaptor and forced against the guide adaptor, the bolt threaded into a hole of the pedestal assembly carrier; and
        three or more servo motor assemblies that are each attached to the base bracket via the pivot joints and to the pedestal assembly carrier by the three or more bearing assemblies.

20. The chamber of claim 19, wherein the inner race and the outer race are configured to slide on each other without radial motion.

* * * * *